(12) United States Patent
Yang et al.

(10) Patent No.: US 10,988,840 B2
(45) Date of Patent: Apr. 27, 2021

(54) CRYSTAL OSCILLATION PROBE STRUCTURE AND EVAPORATION DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yifan Yang, Beijing (CN); Peng Cao, Beijing (CN); Ming Zhao, Beijing (CN); Wanmei Qing, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 99 days.

(21) Appl. No.: 16/400,425

(22) Filed: May 1, 2019

(65) Prior Publication Data

US 2020/0080194 A1    Mar. 12, 2020

(30) Foreign Application Priority Data

Sep. 7, 2018   (CN) .......................... 201811042628.2

(51) Int. Cl.
*C23C 14/54*        (2006.01)
*C23C 14/24*        (2006.01)
(Continued)

(52) U.S. Cl.
CPC ............ *C23C 14/546* (2013.01); *C23C 14/24* (2013.01); *G01B 17/02* (2013.01);
(Continued)

(58) Field of Classification Search
CPC .................................................... C23C 14/546
See application file for complete search history.

(56) References Cited

U.S. PATENT DOCUMENTS

2010/0266747 A1* 10/2010 Strickland ............. C23C 14/546
                                                        118/712
2014/0076232 A1*  3/2014 Park ...................... C23C 14/546
                                                        118/712
(Continued)

FOREIGN PATENT DOCUMENTS

CN         101329292 A      12/2008
CN         104165573 A      11/2014
(Continued)

OTHER PUBLICATIONS

The First Chinese Office Action dated Dec. 11, 2019; Appln. No. 201811042628.2.

*Primary Examiner* — Binu Thomas

(57) ABSTRACT

A crystal oscillation probe structure and an evaporation device are provided. The crystal oscillation probe structure includes a guide cover, a crystal oscillation probe and a mesh screen structure, the guide cover includes a chamber with a guide opening, the crystal oscillation probe is fixed in the chamber, the crystal oscillation probe includes at least one crystal oscillation sheet, the mesh screen structure includes a plurality of openings, and the mesh screen structure is located on a traveling path of a material traveling toward the at least one crystal oscillation sheet and disposed on a side of the at least one crystal oscillation sheet facing the guide opening.

20 Claims, 6 Drawing Sheets

(51) Int. Cl.
*G01B 17/02* (2006.01)
*G01N 29/24* (2006.01)
*H01L 41/053* (2006.01)
H01L 51/56 (2006.01)
G01B 7/06 (2006.01)

(52) U.S. Cl.
CPC ..... *G01N 29/2443* (2013.01); *H01L 41/0533* (2013.01); *G01B 7/066* (2013.01); *H01L 51/56* (2013.01)

(56) References Cited

U.S. PATENT DOCUMENTS

| | | |
|---|---|---|
| 2016/0216099 A1 | 7/2016 | Wu et al. |
| 2016/0216143 A1* | 7/2016 | Choi .................... C23C 14/546 |
| 2017/0191156 A1* | 7/2017 | Jia ........................ C23C 14/546 |
| 2019/0382884 A1* | 12/2019 | Liu ....................... C23C 14/546 |

FOREIGN PATENT DOCUMENTS

| | | | |
|---|---|---|---|
| CN | 104294220 A | | 1/2015 |
| CN | 105603379 A | | 5/2016 |
| CN | 205373621 U | | 7/2016 |
| CN | 107385406 A | | 11/2017 |
| CN | 206706202 U | | 12/2017 |
| CN | 206772938 U | | 12/2017 |
| CN | 107779822 A | | 3/2018 |
| JP | S58174804 A | * | 10/1983 |
| JP | 59118884 A | | 7/1984 |
| JP | H04168311 A | * | 6/1992 |
| JP | H04204201 A | * | 7/1992 |
| KR | 1020150145933 A | * | 12/2015 |

* cited by examiner

CRYSTAL OSCILLATION PROBE STRUCTURE AND EVAPORATION DEVICE

The present application claims priority of the Chinese patent application No. 201811042628.2, filed on Sep. 7, 2018, the disclosure of which is incorporated herein by reference as part of the application.

TECHNICAL FIELD

At least one embodiment of the present disclosure relates to a crystal oscillation probe structure and an evaporation device.

BACKGROUND

In recent years, electronic display products such as mobile phones with an organic light-emitting display (OLED) have been widely accepted by users, and the OLED can be made into a flexible screen or even a folding screen, which has great development prospects. A core light-emitting portion (for example, an organic light-emitting functional layer) of the OLED is formed by an evaporation process, and thus a control on a film thickness of the organic light-emitting functional layer is critical.

In an evaporation process, a film thickness of an organic light-emitting functional layer is usually monitored by a crystal oscillation probe structure, a material which is used to form the organic light-emitting functional layer may be deposited on a crystal oscillation sheet located in the crystal oscillation probe structure, and the material increases the thickness of the crystal oscillation sheet, thereby reducing an monitoring accuracy of the crystal oscillation probe structure. For the crystal oscillation probe structure in the prior art, the thickness of the crystal oscillator sheet increases at a relatively large rate, which causes the monitoring accuracy of the crystal oscillation probe structure to decrease too fast, and the crystal oscillation sheet needs to be frequently replaced, which is costly and cannot meet the production requirements.

SUMMARY

At least one embodiment of the present disclosure provides a crystal oscillation probe structure, the crystal oscillation probe structure comprises a guide cover, a crystal oscillation probe and a mesh screen structure, the guide cover comprises a chamber with a guide opening, the crystal oscillation probe is fixed in the chamber, the crystal oscillation probe comprises at least one crystal oscillation sheet, the mesh screen structure comprises a plurality of openings, and the mesh screen structure is located on a traveling path of a material traveling toward the at least one crystal oscillation sheet and disposed on a side of the at least one crystal oscillation sheet facing the guide opening.

For example, in a crystal oscillation probe structure according to at least one embodiment of the present disclosure, the mesh screen structure is fixed to the guide cover.

For example, in a crystal oscillation probe structure according to at least one embodiment of the present disclosure, the mesh screen structure is disposed at the guide opening.

For example, in a crystal oscillation probe structure according to at least one embodiment of the present disclosure, the mesh screen structure is located in the chamber and between the flow guide opening and the at least one crystal oscillation sheet.

For example, in a crystal oscillation probe structure according to at least one embodiment of the present disclosure, the mesh screen structure is located outside the guide cover.

For example, in a crystal oscillation probe structure according to at least one embodiment of the present disclosure, the flow guide opening and the mesh screen structure are in circular shape.

For example, in a crystal oscillation probe structure according to at least one embodiment of the present disclosure, the openings are evenly arranged outwardly centering on a circular center of the mesh screen structure.

For example, in a crystal oscillation probe structure according to at least one embodiment of the present disclosure, an opening ratio of the mesh screen structure is 1/10~1/2.

For example, in a crystal oscillation probe structure according to at least one embodiment of the present disclosure, a shape of each of the openings is circular, and a diameter of each of the openings is 0.5 mm to 4 mm.

For example, in a crystal oscillation probe structure according to at least one embodiment of the present disclosure, at least a portion of the guide cover is in a tubular shape, a cross-sectional shape of the tubular shape includes one of a circle, an ellipse, a triangle, a rectangle, and a polygon, and a shape of each of the openings includes one of a triangle, a circle, a rectangle, and a polygon.

For example, in a crystal oscillation probe structure according to at least one embodiment of the present disclosure, the crystal oscillation probe includes a pedestal, and the at least one crystal oscillation sheet is fixed on a side of the pedestal facing the flow guiding opening.

For example, in a crystal oscillation probe structure according to at least one embodiment of the present disclosure, one crystal oscillation sheet is disposed on the pedestal, and an orthographic projection of the one crystal oscillation sheet on the pedestal is located within an orthographic projection of the flow guide opening on the pedestal.

For example, in a crystal oscillation probe structure according to at least one embodiment of the present disclosure, at least two crystal oscillation sheets are disposed on the pedestal, a shielding plate is disposed on the pedestal, the shielding plate is located between the crystal oscillation sheet and the guide opening, and an orthographic projection of one of the crystal oscillation sheets on the pedestal is outside an orthographic projection of the shielding plate on the pedestal, an orthographic projection of remaining crystal oscillation sheets on the pedestal is located within the orthographic projection of the shielding plate on the pedestal.

For example, a crystal oscillation probe structure according to at least one embodiment of the present disclosure further comprises an operating lever, and one end of the operating lever is connected to the shielding plate, and another end of the operating lever extends to outside of the guide cover.

For example, a crystal oscillation probe structure according to at least one embodiment of the present disclosure further comprises a driving unit on the pedestal, and the driving unit is connected to the shielding plate, and the driving unit is configured to drive the shielding plate to rotate such that the crystal oscillation sheets are sequentially exposed to the guide opening.

For example, in a crystal oscillation probe structure according to at least one embodiment of the present disclosure, an inner diameter of the chamber is equal to an inner diameter of the flow guide opening.

For example, in a crystal oscillation probe structure according to at least one embodiment of the present disclosure, at least two crystal oscillation sheets are disposed on the pedestal, an orthographic projection of one of the crystal oscillation sheets on the pedestal is within an orthographic projection of the guide opening on the pedestal, and an orthographic projection of remaining crystal oscillation sheets on the pedestal is outside the orthographic projection of the guide opening on the pedestal.

For example, a crystal oscillation probe structure according to at least one embodiment of the present disclosure further comprises a driving unit on the pedestal, and the driving unit is configured to drive the pedestal to rotate such that the crystal oscillation sheets sequentially correspond to the guide opening.

At least one embodiment of the present disclosure provides an evaporation device, the evaporation device comprises the crystal oscillation probe structure according to any one of the embodiment above-mentioned.

For example, an evaporation device according to at least one embodiment of the present disclosure further comprises an evaporation chamber, an evaporation source, and a fixed structure of substrate to be vapor-deposited, wherein the evaporation source, the fixed structure of substrate to be vapor-deposited and the crystal oscillation probe structure are located in the evaporation chamber, the fixed structure of substrate to be vapor-deposited and the crystal oscillation probe structure are disposed side by side on a same side of the evaporation source, and the guide opening of the crystal oscillation probe structure is disposed to face the evaporation source.

BRIEF DESCRIPTION OF THE DRAWINGS

In order to demonstrate clearly technical solutions of the embodiments of the present disclosure, the accompanying drawings in relevant embodiments of the present disclosure will be introduced briefly. It is apparent that the drawings may only relate to some embodiments of the disclosure and not intended to limit the present disclosure.

DETAILED DESCRIPTION

Figure 1A:
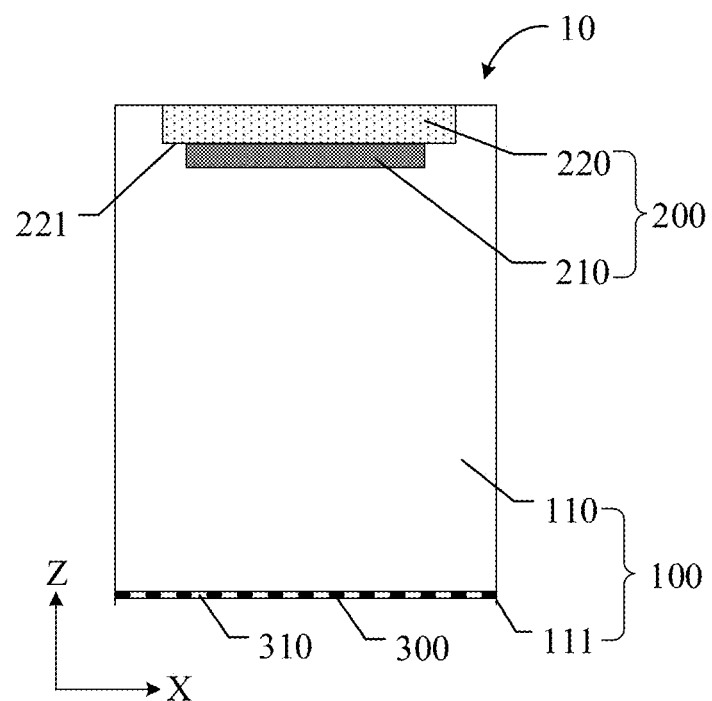
FIG. 1A is a cross-sectional view of a crystal oscillation probe structure according to some embodiments of the present disclosure.

In order to make objects, technical details and advantages of the embodiments of the disclosure apparent, the technical solutions of the embodiment will be described in a clearly and fully understandable way in connection with the drawings related to the embodiments of the disclosure. It is apparent that the described embodiments are just a part but not all of the embodiments of the disclosure. Based on the described embodiments herein, those skilled in the art may obtain other embodiment, without any creative work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "comprise/comprising," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may comprise an electrical connection/coupling, directly or indirectly. The terms, "on," "under," "left," "right," or the like are only used to indicate relative position relationship, and when the position of the object which is described is changed, the relative position relationship may be changed accordingly.

A crystal oscillation sheet in a crystal oscillation probe structure may be a quartz crystal oscillation sheet, in an evaporation process, the quartz crystal oscillation sheet mainly utilizes a piezoelectric effect and a mass loading effect of the quartz crystal to monitor a thickness of a film to be formed. The quartz crystal is a crystal of ionic type, due to a regular distribution of a crystal lattice of the quartz crystal, in a case where a mechanical deformation such as stretching or compression occurs, the quartz crystal can cause an electric polarization phenomenon, which is called a piezoelectric phenomenon. The piezoelectric phenomenon has an inverse phenomenon, that is, as an electric field changes, a size of the quartz crystal also changes correspondingly, such as lengths or shortens. A natural frequency of a piezoelectric effect of the quartz crystal depends not only on a geometry size and a dicing type of the quartz crystal, but also on a thickness of the quartz crystal (for example, a crystal oscillation sheet composed of the quartz crystal). In a case where a certain layer is deposited on the crystal oscillation sheet, the thickness of the crystal oscillation sheet increases, then the natural frequency of the crystal oscillation sheet is correspondingly attenuated, this effect of the crystal oscillation sheet is the mass loading effect. Therefore, the crystal oscillation probe structure can monitor a thickness of a deposited film by measuring a frequency change or a change in frequency-dependent parameters of the crystal oscillation sheet.

In an evaporation process, if the natural frequency of the crystal oscillation sheet decreases too much, a precision of the crystal oscillation probe structure for monitoring the thickness of the deposited film is lowered, and the crystal oscillation probe structure cannot work stably, which results in a frequency modulation phenomenon. In order to ensure a stable and high sensitivity of the crystal oscillation probe structure, after a film on the crystal oscillation sheet is deposited to a certain thickness, the crystal oscillation sheet needs to be replaced by a new crystal oscillation sheet.

The crystal oscillation probe structure in the prior art is limited by its own design, and the thickness of the film formed on the crystal oscillation sheet increases too fast. In an evaporation process, a repeatability of monitoring the thickness of the deposited film by the crystal probe structure is also not good, and the thickness of each of a plurality of films formed in sequence is continuously attenuated and a degree of an attenuation is large. Therefore, the life of the crystal oscillation sheet is short, the crystal oscillation sheet needs to be frequently replaced, and the cost is increased.

At least one embodiment of the present disclosure provides a crystal oscillation probe structure, and the crystal oscillation probe structure includes a guide cover, a crystal oscillation probe and a mesh screen structure. The guide cover includes a chamber with a guide opening, the crystal oscillation probe is fixed in the chamber, the crystal oscillation probe includes at least one crystal oscillation sheet, the mesh screen structure includes a plurality of openings, and the mesh screen structure is located on a traveling path of a material toward the at least one crystal oscillation sheet and disposed on a side of the at least one crystal oscillation sheet facing the guide opening. For example, the guide opening allows the chamber to communicate with outside of the chamber, such that a material (for example, the material to be deposited) can enter the chamber of the guide cover from the outside through the guide opening to be deposited (for example, evaporated) on the crystal oscillation sheet. The mesh screen structure is located on a traveling path of the material, which can reduce the flow amount of the external material such as evaporation material into the chamber. Thus, compared with a case where the mesh screen structure is not provided, a thickness increase rate of the film formed on the crystal oscillation sheet by deposition of an external evaporation material is reduced, and correspondingly, a frequency decrease rate of the crystal oscillation sheet is decreased, a service life of the crystal oscillation sheet is prolonged, and a monitoring accuracy of the crystal oscillation probe structure is improved, and the repeatability of monitoring the thickness of the formed film by the crystal probe structure is high.

Hereinafter, a crystal oscillation probe structure and an evaporation device according to at least one embodiment of the present disclosure are to be described with reference to the accompanying drawings.

Figure 1B:
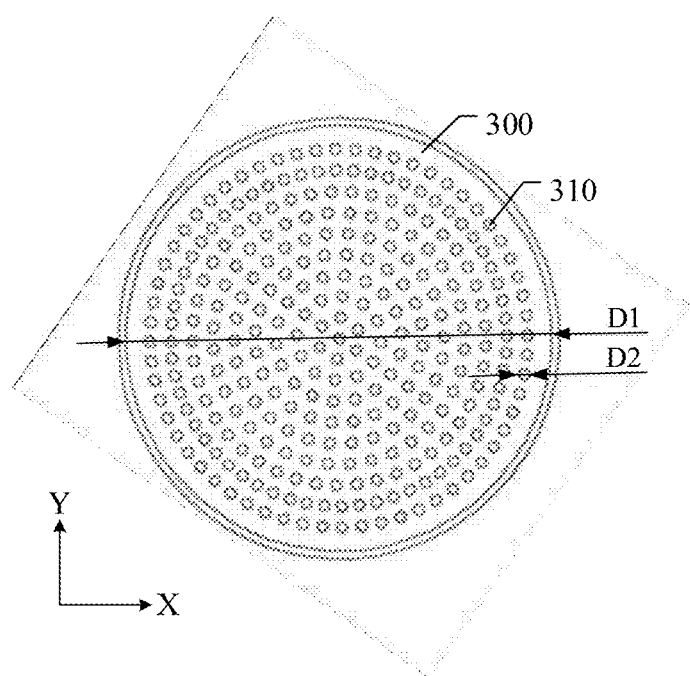
FIG. 1B is a plan view of a mesh screen structure of the crystal oscillation probe structure shown in FIG. 1A.

FIG. 1A is a cross-sectional view of a crystal oscillation probe structure according to some embodiments of the present disclosure, and FIG. 1B is a plan view of a mesh screen structure of the crystal oscillation probe structure shown in FIG. 1A.

For example, in at least one embodiment of the present disclosure, as shown in FIG. 1A and FIG. 1B, the crystal oscillation probe structure 10 includes a guide cover 100, a crystal oscillation probe 200 and a mesh screen structure 300, the guide cover 100 includes a chamber 110 with a guide opening 111, the guide opening 111 allows the chamber 110 to communicate with outside of the chamber 110, the crystal oscillation probe 200 is fixed in the chamber 110, the crystal oscillation probe 200 includes at least one crystal oscillation sheet 210, the mesh screen structure 300 includes a plurality of openings 310, and the mesh screen structure 300 is disposed at the guide cover 100 and located on a side of the crystal oscillation probe 200 facing the guide opening 111. In an evaporation process, compared with a case where the mesh screen structure 300 is not provided, the flow amount of the evaporation material passing through the mesh screen structure 300 is reduced, correspondingly, a deposition rate of the evaporation material on the crystal oscillation sheet 210 is reduced, that is, an thickness increase rate of the film formed on the crystal oscillation sheet 210 by deposition of the evaporation material is lowered, and the frequency decrease rate of the crystal oscillation sheet 210 is decreased.

For example, in a crystal oscillation probe structure provided by at least one embodiment of the present disclosure, the mesh screen structure may be fixed to the guide cover. The guide cover (or the chamber therein) may be used to define a traveling path of the material, thus installation positions of the mesh screen structure and the guide cover are fixed, such that in a case where the mesh screen structure needs to be disassembled and installed, an actual installation position the mesh screen structure is the same as a preset position, which prevents a monitoring accuracy of the crystal oscillation probe structure from being adversely affected due to an offset of the installation position of the mesh screen structure, for example, an adverse effect on a calculation of the second correction value in the following embodiments is prevented.

For example, in a crystal oscillation probe structure provided by some embodiments of the present disclosure, the mesh screen structure may be fixed to the guide opening. Illustratively, as shown in FIG. 1A, the mesh screen structure 300 is fixed on the guiding opening 111, and the external evaporation material must pass through the mesh screen structure 300 before being deposited on the crystal oscillation sheet 210. Thus, the mesh screen structure 300 improves a control accuracy of the flow amount of the evaporation material into the chamber 110, which is advantageous for accurately controlling a monitoring accuracy of the crystal oscillation probe structure 10.

Figure 1C:
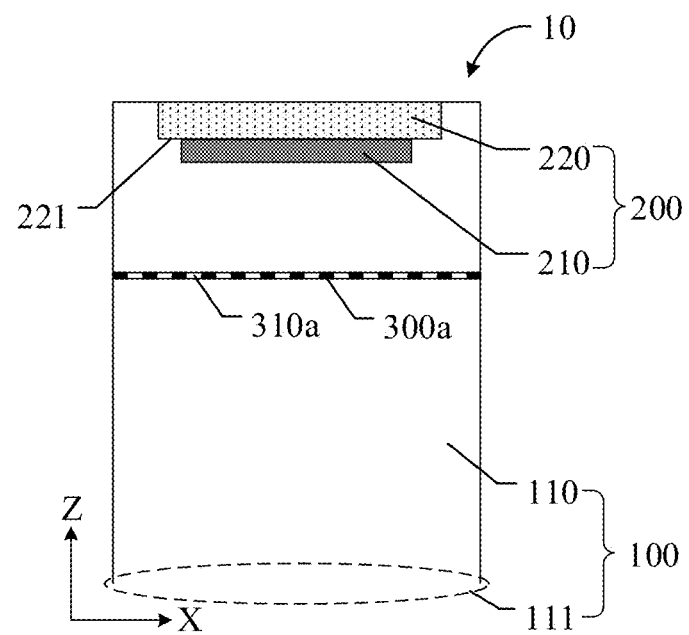
FIG. 1C is a cross-sectional view of another crystal oscillation probe structure according to some embodiments of the present disclosure.

For example, in a crystal oscillation probe structure provided by some other embodiments of the present disclosure, the mesh screen structure is located inside the chamber and between the guide opening and the crystal oscillation sheet. Illustratively, as shown in FIG. 1C, the mesh screen structure 300a is fixed in the chamber 110 of the guide cover 100, the evaporation material is deposited on the crystal oscillation sheet 210 after sequentially passing through the guide opening 111 and the mesh screen structure 300a. Thus, in a direction of the X-axis, a position of the mesh screen structure 300a does not deviate due to a limitation of the chamber 110, and a distribution of the opening 310a of the mesh screen structure 300a is constant or changed only along an axial direction (for example, a direction parallel to the Z-axis), an influence of reinstalling the mesh screen structure 300a on the distribution of the evaporation material is small, thereby the mesh screen structure 300a improves a control precision of the flow amount of the evaporation material into the chamber 110, which is advantageous for a precise control of a monitoring accuracy of the crystal oscillation probe structure 10.

Figure 1D:
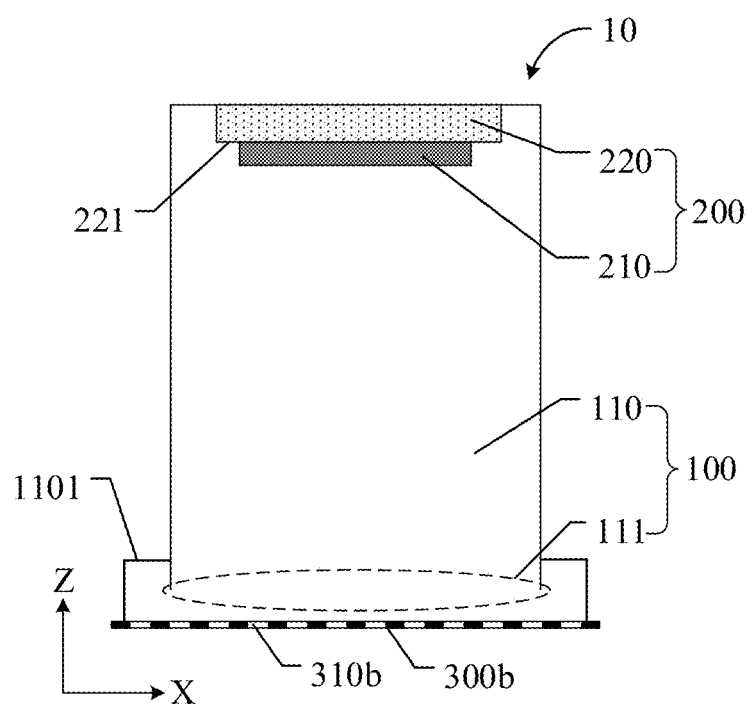
FIG. 1D is a cross-sectional view of another crystal oscillation probe structure according to some embodiments of the present disclosure.

For example, in a crystal oscillation probe structure provided by some other embodiments of the present disclosure, the mesh screen structure is located on a side of the crystal oscillation sheet facing the outside environment. Illustratively, as shown in FIG. 1D, the mesh screen structure 300b is fixed on an outer side of the guide cover 100, and the evaporation material is deposited on the crystal oscillation sheet 210 after sequentially passing through the mesh screen structure 300b and the guide opening 111. After multiple evaporation operations, a deposition amount of the evaporation material on the guide cover such as an inner wall of the guide cover is gradually increased, which affects inner diameter of the chamber 110 and size of the guide opening 111, thereby adversely affecting the monitoring accuracy of the crystal oscillation probe structure 10. In a case of adopting the above design, the deposition amount of the evaporation material on the guide cover 100 can be reduced, which is advantageous for accurately controlling the monitoring precision of the crystal oscillation probe structure 10. For example, the guide cover 100 further includes a position limiting structure 1101 for fixing the mesh screen structure 300b.

For example, in a crystal oscillation probe structure provided by at least one embodiment of the present disclosure, the guide opening and the mesh screen structure are in circular shape. For example, a plurality of openings are evenly distributed in the mesh screen structure, for example, a plurality of openings are evenly arranged outwardly by taking on a circular center of the mesh screen structure as a center. Illustratively, as shown in FIG. 1B, a planar shape of the mesh screen structure 300 is circular, and the plurality of openings 310 are evenly distributed from the inside to the outside centering on a circular center of the mesh screen structure 300. Thus, a distribution of the external evaporation material after passing through the mesh screen structure 300 is relatively uniform. In addition, after the mesh screen structure 300 is disassembled from and reinstalled to the crystal oscillation probe structure 10, even if the mesh screen structure 300 has an axial rotation compared to the original position, the distribution of the evaporation material after passing through the mesh screen structure 300 is still relatively uniform, such that a thickness uniformity of a film formed by depositing the evaporation material on the crystal oscillation sheet 210 is good, which ensures that the crystal oscillation probe structure 300 has a high monitoring precision.

For example, in a crystal oscillation probe structure provided by at least one embodiment of the present disclosure, an opening ratio of the mesh screen structure is 1/10~1/2, for example, further 1/3, 1/5, 1/7, 1/9, or the like. The opening ratio is a ratio value of a sum of the areas of all openings to an area of the mesh screen structure. In a case of not considering an influence of other factors, the increase rate of the thickness of the film deposited on the crystal oscillation sheet is substantially positively correlated with the opening ratio of the mesh screen structure, that is, the smaller the opening ratio of the mesh screen structure, the smaller the thickness increase rate of the film deposited on the crystal oscillation sheet, and the longer the service life of the crystal oscillation sheet. For example, the opening ratio of the mesh screen structure is 1/5, and compared with a case that the mesh screen structure is not disposed in the crystal oscillation probe structure, the service life of the crystal oscillation sheet of the crystal oscillation probe structure which having the mesh screen structure can be increased about 5 times. It should be noted that, in the embodiments of the present disclosure, the opening ratio of the mesh screen structure may also be other values, which is not limited to the above-mentioned numerical range.

In at least one embodiment of the present disclosure, the shape of each of the openings of the mesh screen structure is not limited. For example, the shape of each of the openings may include one of a triangle, a circle, a rectangle, and a polygon, and may be other shapes. Illustratively, as shown in FIG. 1B, each of the openings 310 is in a circular shape. The circular openings 310 make the evaporation material through the mesh screen structure 300 evenly distributed, such that a thickness uniformity of a film formed by depositing the evaporation material on the crystal oscillation sheet is good, which ensures that the crystal oscillation probe structure has a high monitoring precision.

For example, in a crystal oscillation probe structure provided by at least one embodiment of the present disclosure, each of the openings of the mesh screen structure is in a circular shape, and a diameter of each of the openings is 0.5 to 4 mm. Illustratively, as shown in FIG. 1B, the diameter D2 of each of the openings 310 is 0.5 to 4 mm. In a case where the diameter of each of the openings 310 has the above numerical range, the diameter of each of the openings 310 is not too small, which hingers the external evaporation material from passing through the mesh screen structure 300, also is not too large, which makes the evaporation material passing through the mesh screen structure 300 unevenly distributed.

For example, in a crystal oscillation probe structure provided by at least one embodiment of the present disclosure, at least a portion of the guide cover is in a tubular shape, a cross-sectional shape of the tubular shape includes one of a circle, an ellipse, a triangle, a rectangle, and a polygon, or other shapes. For example, in a case where the guide cover is in a tubular shape and the cross-sectional shape of the tubular shape is circular, the guide cover is in a cylindrical shape, and a plane on which the cross-section is located is perpendicular to an axis line of the cylindrical shape.

For example, in a crystal oscillation probe structure provided by at least one embodiment of the present disclosure, at least a portion of the guide cover may be in a cylindrical shape. Illustratively, as shown in FIG. 1A and FIG. 1B, the guide cover 100 is in a cylindrical shape, and a cross-sectional shape of the guide cover 100 along X and Y is circular. For example, the guide cover 100 is designed to have an inner diameter equal to the diameter of the mesh screen structure 300, that is, the cross-sectional shape of the guide cover 100 along X and Y and a planar shape of the mesh screen structure 300 are circular. Thus, in a case where the evaporation material passing through the mesh screen structure 300 is flowing in the guide cover 100, the evaporation material is relatively uniformly distributed.

For example, in a crystal oscillation probe structure provided by at least one embodiment of the present disclosure, the crystal oscillation probe includes a pedestal, and the crystal oscillation sheet is fixed on a side of the pedestal facing the guide opening. Illustratively, as shown in FIG. 1A, the crystal oscillation probe 200 includes a pedestal 220, the pedestal 220 is fixed on the guide cover 100. For example, a surface 221 of the pedestal 220 facing the guide opening 111 may be provided with a clamping structure, an adsorption structure, or the like, for fixing the crystal oscillation sheet 210.

In at least one embodiment of the present disclosure, the number of the crystal oscillation sheets in the crystal oscillation probe structure is not limited, and the number of the crystal oscillation sheets or the specific structures of the crystal oscillation probe structure may be designed according to actual process requirements.

For example, in a crystal oscillation probe structure provided by at least one embodiment of the present disclosure, one crystal oscillation sheet is disposed on the pedestal, and an orthographic projection of the one crystal oscillation sheet on the pedestal is located within an orthographic projection of the guide opening on the pedestal. For example, as shown in FIG. 1A, a crystal oscillation sheet 210 is disposed on the pedestal 220 of the crystal oscillation probe structure 10. An orthographic projection of the crystal oscillation sheet 210 on a plane (for example, a plane on which the surface 221 is located) on which the pedestal 220 is located within an orthographic projection of the guide opening 111 on a plane on which the pedestal 220 is located, thus, a surface of the crystal oscillation sheet 210 facing the guide opening 111 is covered by the evaporation material passed through the mesh screen structure 300, and a thickness uniformity of the film formed by depositing the evaporation material on the crystal oscillation sheet 210 is good. In a case where only one crystal oscillation sheet is disposed in the crystal probe structure, the crystal oscillation probe structure may be set to have a small volume, thereby the structure is simple, and the cost is small. In addition, in an actual production process, the crystal oscillation probe structure may be applied in the manufacturing process of a small-sized product (for example, a display screen with a size of 200 mm×200 mm).

Figure 2:
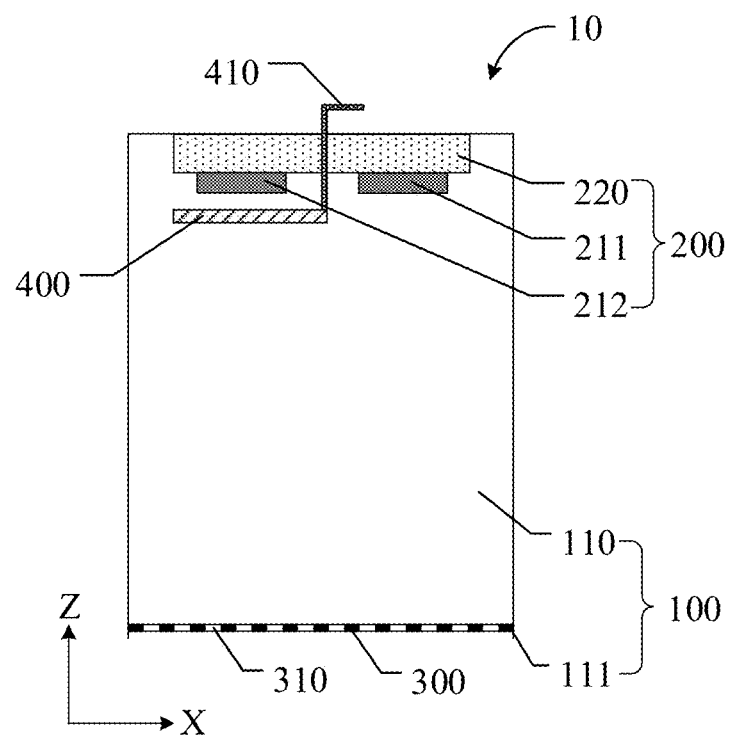
FIG. 2 is a cross-sectional view of another crystal oscillation probe structure according to some embodiments of the present disclosure.
Figure 3:
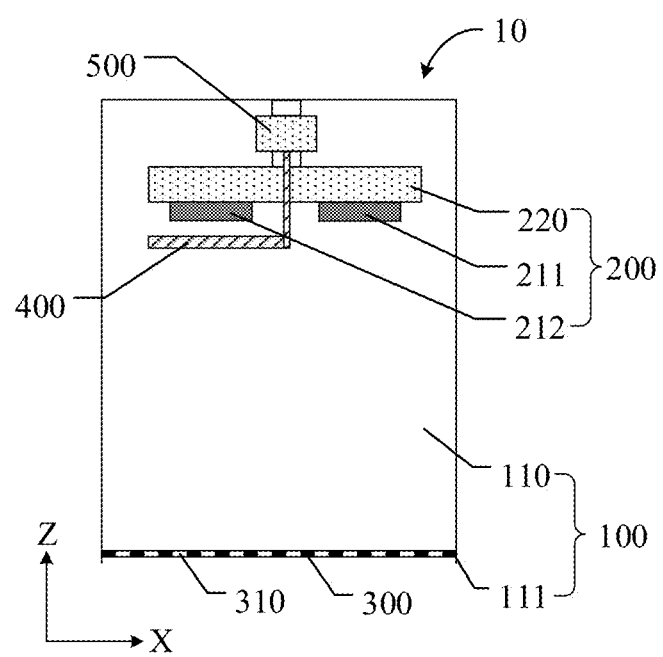
FIG. 3 is a cross-sectional view of another crystal oscillation probe structure according to some embodiments of the present disclosure.

FIG. 2 is a cross-sectional view of another crystal oscillation probe structure according to some embodiments of the present disclosure, and FIG. 3 is a cross-sectional view of another crystal oscillation probe structure according to some embodiments of the present disclosure.

For example, in a crystal oscillation probe structure provided by at least one embodiment of the present disclosure, at least two crystal oscillation sheets are disposed on the pedestal, and a shielding plate is disposed on the pedestal, the shielding plate is located between the crystal oscillation sheet and the guide opening. An orthographic projection of one of the crystal oscillation sheets on the pedestal is outside an orthographic projection of the shielding plate on the pedestal, and an orthographic projection of remaining crystal oscillation sheets on the pedestal is located within the orthographic projection of the shielding plate on the pedestal. Illustratively, as shown in FIG. 2, two crystal oscillation sheets are disposed on the pedestal 220, the two crystal oscillation sheets are a first crystal oscillation sheet 211 and a second crystal oscillation sheet 212, and a shielding plate 400 is located between the crystal oscillation sheets and the guide opening 111. In a first evaporation process, an orthographic projection of the first crystal oscillation sheet 211 on the pedestal 220 is outside an orthographic projection of the shielding plate 400 on the pedestal 220, that is, the first crystal oscillation sheet 211 is not blocked by the shielding plate 400; and an orthographic projection of the second crystal oscillation sheet 212 on the pedestal 220 is located within the orthographic projection of the shielding plate 400 on the pedestal 220, that is, the second crystal oscillation sheet 212 is blocked by the shielding plate 400. Thus, in the first evaporation process, the external evaporation material is only deposited on the first crystal oscillation sheet 211, that is, in the first evaporation process, the first crystal oscillation sheet 211 is used, and the second crystal oscillation sheet 212 is not used.

For example, for the crystal oscillation probe structure 10 shown in FIG. 2, during a second evaporation process, the shielding plate 400 is moved such that the shielding plate 400 blocks the first crystal oscillation sheet 211 and does not block the second crystal oscillation sheet 212, that is, in the second evaporation process, the second crystal oscillation sheet 212 is used, and the first crystal oscillation sheet 211 is not used. Thus, in a plurality of evaporation processes, the first crystal oscillation sheet 211 and the second crystal oscillation sheet 212 may be used in turn. A loss speed of each of the crystal oscillation sheets of the crystal oscillation probe structure including two or more crystal oscillation sheets is small, that is, the life of each of the crystal oscillation sheets is prolonged, and the monitoring accuracy of the crystal oscillation probe structure is high. In at least one embodiment of the present disclosure, in a case where a shielding plate is disposed in the crystal oscillation probe structure, the specific structures of the shielding plate may be designed as needed, thereby selecting manners of moving the shielding plate, which is not limited herein.

For example, in some embodiments of the present disclosure, as shown in FIG. 2, an operating lever 410 connected to the shielding plate 400 may be disposed in the crystal oscillation probe structure 10. One end of the operating lever 410 is connected to the shielding plate 400, and the other end of the operating lever 410 extends to an outside of the guide cover 100, and the outside is an outer side of the chamber 110. The operating lever 410 is controlled to rotate the shielding plate 400 such that the shielding plate 400 blocks the first crystal oscillation sheet 211 or the second crystal oscillation sheet 212.

For example, in some other embodiments of the present disclosure, the crystal oscillation probe structure may include a driving unit located on the pedestal. The driving unit is connected to the shielding plate, and the driving unit is configured to drive the shielding plate to rotate such that the crystal oscillation sheets are sequentially exposed to the guide opening. Illustratively, as shown in FIG. 3, a driving unit 500 is fixed on the pedestal 220 and connected to the shielding plate 400, and during different evaporation processes, the driving unit 500 drives the shielding plate 400 to rotate, such that the shielding plate 400 blocks the first crystal oscillation sheet 211 or blocks the second crystal oscillation sheet 212. For example, the drive unit 500 may be a rotary motor (for example, a rotating electrical machine). It should be noted that the position of the driving unit 500 may be designed according to actual needs. For example, the driving unit 500 may be located on a side of the pedestal 220 away from the shielding plate 400, or the driving unit 500 may be located on a side of the pedestal 220 facing the shielding plate 400.

For example, in a crystal oscillation probe structure provided by at least one embodiment of the present disclosure, in the case where a shielding plate is provided in the crystal oscillation probe structure, an inner diameter of the chamber may be equal to an inner diameter of the guide opening. Illustratively, as shown in FIG. 2 and FIG. 3, an inner diameter of the chamber 110 and the inner diameter of the guide opening 111 are equal. Thus, the external evaporation material has an ability to be deposited on all of the crystal oscillation sheets after passing through the mesh screen structure 300, and whether or not the evaporation material is deposited on the crystal oscillator is only related to the position of shielding plate 400, the above design makes the design of the crystal oscillation probe structure simple and low in cost.

Figure 4A:
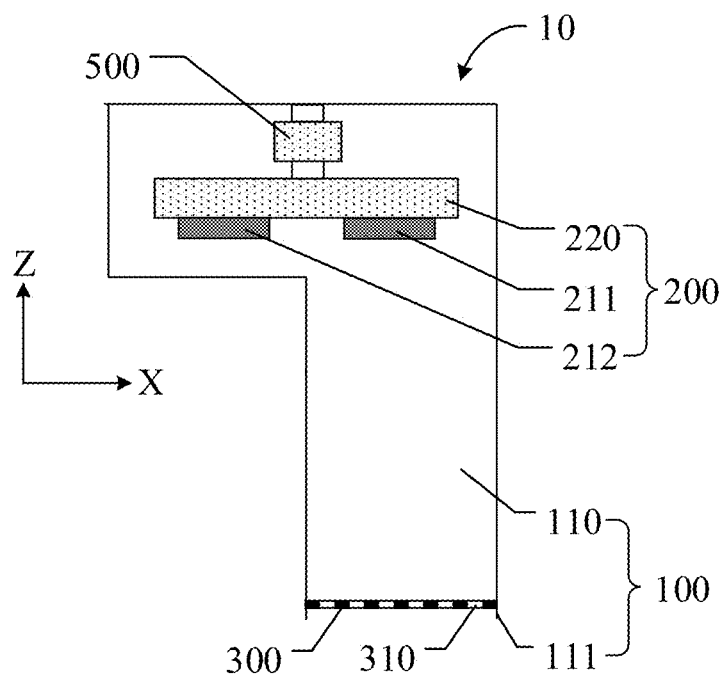
FIG. 4A is a cross-sectional view of another crystal oscillation probe structure according to some embodiments of the present disclosure.

FIG. 4A is a cross-sectional view of another crystal oscillation probe structure according to some embodiments of the present disclosure.

For example, in a crystal oscillation probe structure provided by at least one embodiment of the present disclosure, at least two crystal oscillation sheets are disposed on the pedestal, an orthographic projection of one of the crystal oscillation sheets on the pedestal is within an orthographic projection of the guide opening on the pedestal, and an orthographic projection of remaining crystal oscillation sheets on the pedestal is outside the orthographic projection of the guide opening on the pedestal. Thus, the guide opening only corresponds to one crystal oscillation sheet, in a evaporation process, only one crystal oscillation sheet corresponding to the guide opening can be deposited at a same time. In a case where a plurality of crystal oscillation sheets are used in turn, a loss speed of each of the crystal oscillation sheets is small, that is, the life of each of the crystal oscillation sheets is prolonged, and the monitoring accuracy of the crystal oscillation probe structure is high.

For example, in a crystal oscillation probe structure provided by at least one embodiment of the present disclosure, in a case where the guide opening of the guide cover is designed to correspond to only one of the crystal oscillation sheets, an inner diameter of the portion of the chamber of the guide cover from the guide opening to the crystal oscillation sheets does not change. Illustratively, as shown in FIG. 4A, two crystal oscillation sheets are disposed on the pedestal 220, and the two crystal oscillation sheets are a first crystal oscillation sheet 211 and a second crystal oscillation sheet 212. Compared to a position where the crystal oscillation probe 200 is disposed, at a position where the guide opening 111 is located, an inner diameter of the guide cover 100 is reduced, such that an orthographic projection of the first crystal oscillation sheet 211 on the pedestal 220 is located within an orthographic projection of the guide opening 111 on the pedestal 220, that is, the first crystal oscillation sheet 211 is exposed to the guide opening 111; and an orthographic projection of the second crystal oscillation sheet 212 on the pedestal 220 is located outside an orthographic projection of the guide opening 111 on the pedestal 220, that is, the second crystal oscillation sheet 212 is not exposed to the guide opening 111. Thus, in a first evaporation process, the evaporation material entering through the guide opening 111 is only deposited on the first crystal oscillation sheet 211, that is, in the first evaporation process, the first crystal oscillation sheet 211 is used, and the second crystal oscillation sheet 212 is not used.

Figure 4B:
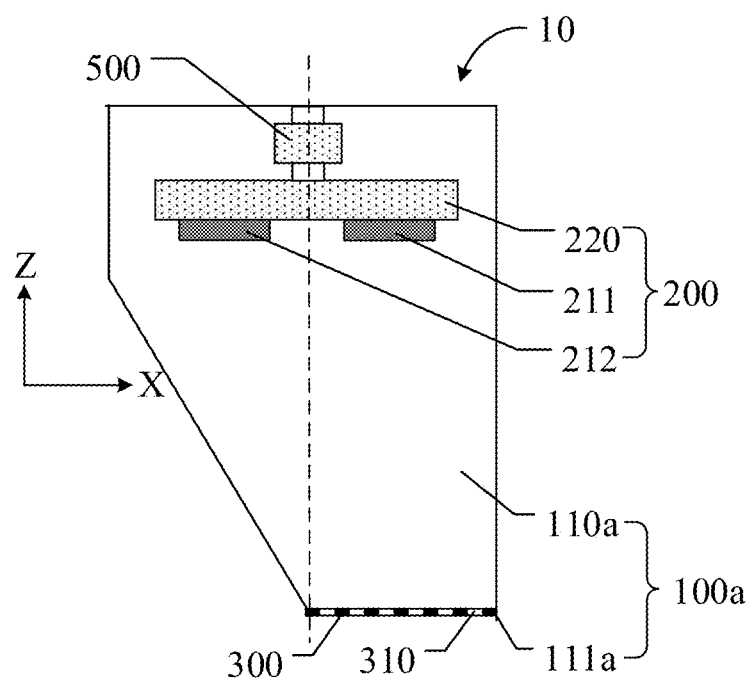
FIG. 4B is a cross-sectional view of another crystal oscillation probe structure according to some embodiments of the present disclosure.

For example, in a crystal oscillation probe structure provided by at least one embodiment of the present disclosure, in a case where the guide opening of the guide cover is designed to correspond to only one of the crystal oscillation sheets, an inner diameter of the portion of the chamber of the guide cover from the guide opening to the crystal oscillation sheets gradually increases. Illustratively, as shown in FIG. 4B, two crystal oscillation sheets are disposed on the pedestal 220, and from a position where the guide opening 111a is disposed to a position where the two crystal oscillation sheets (the first crystal oscillation sheet 211 and the second crystal oscillation sheet 212) are disposed, an inner diameter of the guide cover 100a (for example, a diameter of the chamber 110a) is gradually increased, thus, the guide opening 111a may correspond to one crystal oscillation sheet. For example, an orthographic projection of the first crystal oscillation sheet 211 on the pedestal 220 is located within an orthographic projection of the guide opening 111a on the pedestal 220, the first crystal oscillation sheet 211 is exposed to the guide opening 111a; and an orthographic projection of the second crystal oscillation sheet 212 on the pedestal 220 is located outside an orthographic projection of the guide opening 111a on the pedestal 220, the second crystal oscillation sheet 212 is not exposed to the guide opening 111a. Thus, in a first evaporation process, the evaporation material entering through the guide opening 111a is only deposited on the first crystal oscillation sheet 211, that is, in the first evaporation process, the first crystal oscillation sheet 211 is used, and the second crystal oscillation sheet 212 is not used.

For example, a crystal oscillation probe structure provided by at least one embodiment of the present disclosure further includes a driving unit located on the pedestal, the driving unit is configured to drive the pedestal to rotate such that the crystal oscillation sheets sequentially correspond to the guide opening. Illustratively, as shown in FIG. 4A, the driving unit 500 is fixed on the pedestal 220, and the driving unit 500 may drive the pedestal 220 to rotate. Thus, for the crystal oscillation probe structure shown in FIG. 4A, in a second evaporation process, the driving unit 500 is controlled to rotate the pedestal 220 such that the second crystal oscillation sheet 212 is exposed to the guide opening 111 and the first crystal oscillation sheet 211 is not exposed to the guide opening 111, that is, in the second evaporation process, the second crystal oscillation sheet 212 is used, and the first crystal oscillation sheet 211 is not used. Thus, in a plurality of evaporation processes, the first crystal oscillation sheet 211 and the second crystal oscillation sheet 212 may be used in turn. A Joss speed of each of the crystal oscillation sheets of the crystal oscillation probe structure including two or more crystal oscillation sheets is small, that is, the life of each of the crystal oscillation sheets is prolonged, and the monitoring accuracy of the crystal oscillation probe structure is high. For example, the drive unit 500 may be a rotary motor (for example, a rotating electrical machine).

Figure 8:
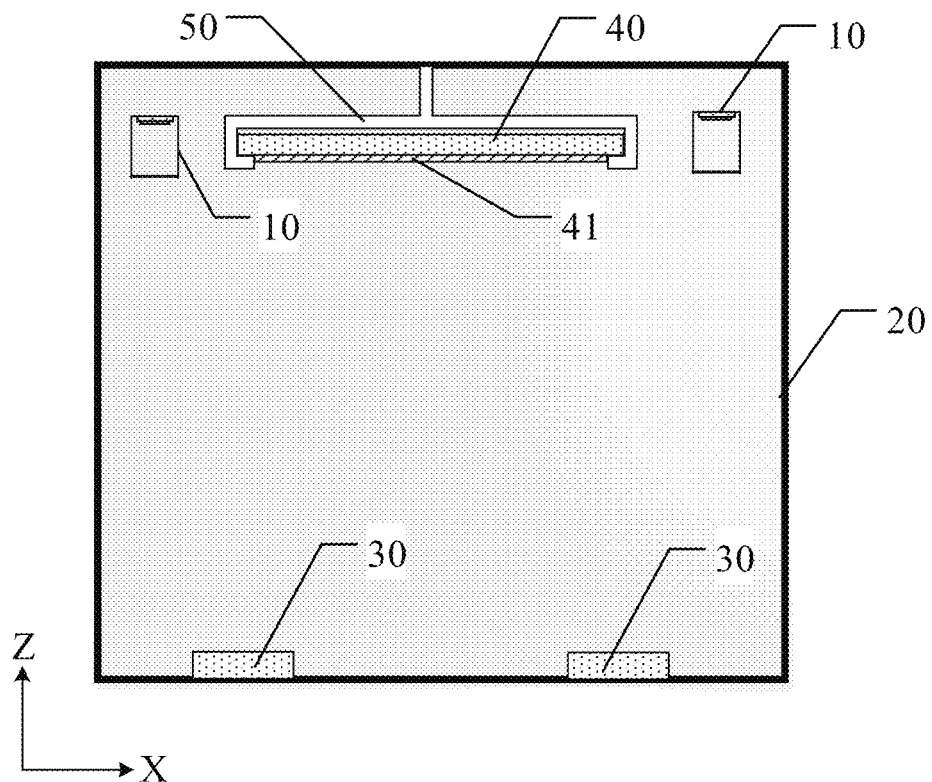
FIG. 8 is a cross-sectional view of an evaporation device according to some embodiments of the present disclosure.

For example, in one example of at least one embodiment of the present disclosure, a crystal oscillation probe structure provided with a mesh screen structure and a crystal oscillation probe structure not provided with a mesh screen structure are compared to describe a crystal oscillation probe structure and an evaporation device according to at least one embodiment of the present disclosure. For example, in the crystal oscillation probe structure shown in FIG. 2, an inner diameter of the guide opening 111 and a diameter of the mesh screen structure 300 (for example, the D1 shown in FIG. 1B) are 81 mm, the mesh screen structure 300 is provided with 292 openings 310, and a diameter of each of the openings 310 (for example, the D2 shown in FIG. 1B) is 2 mm. The crystal oscillation probe structure is applied to an OLED evaporation process (as shown in FIG. 8), and in the entire evaporation process, three films (for example, the film 41 shown in FIG. 8) need to be sequentially formed, and a design thickness of each of the three films is 1000 angstroms.

Figure 5:
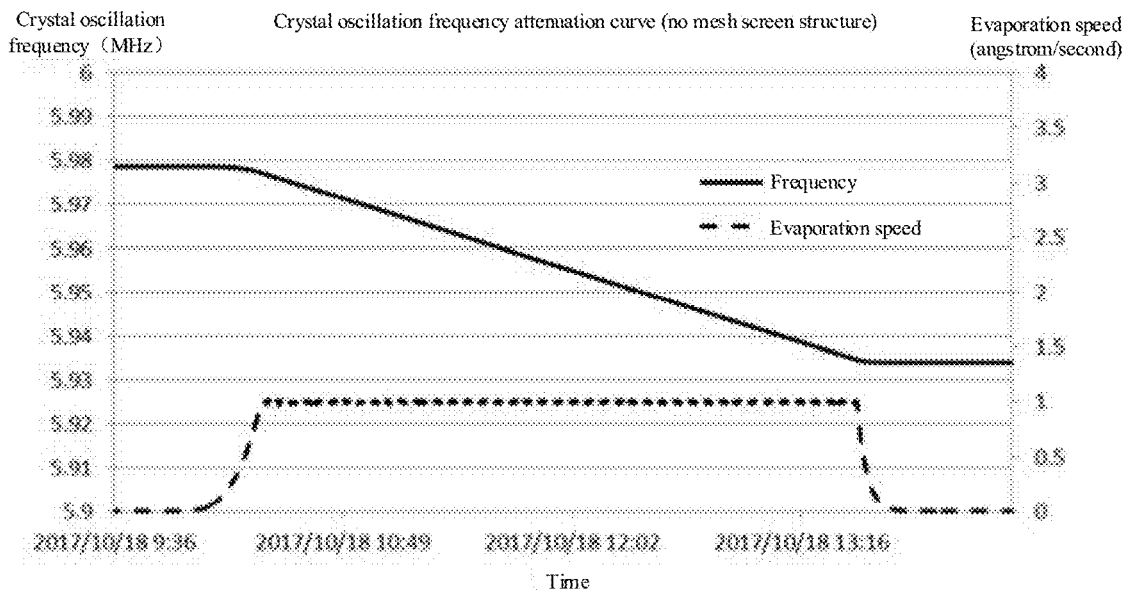
FIG. 5 is a schematic diagram showing crystal oscillation frequency attenuation of a crystal oscillation sheet of a crystal oscillation probe structure.
Figure 6:
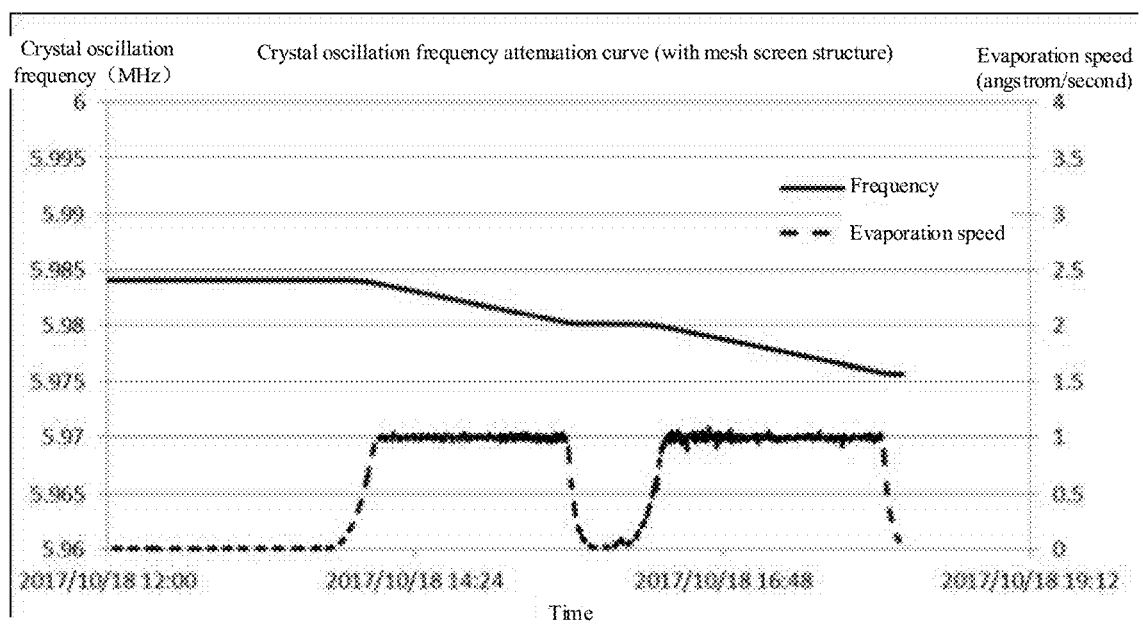
FIG. 6 is a schematic diagram showing crystal oscillation frequency attenuation of a crystal oscillation sheet of a crystal oscillation probe structure according to some embodiments of the present disclosure.
Figure 7:
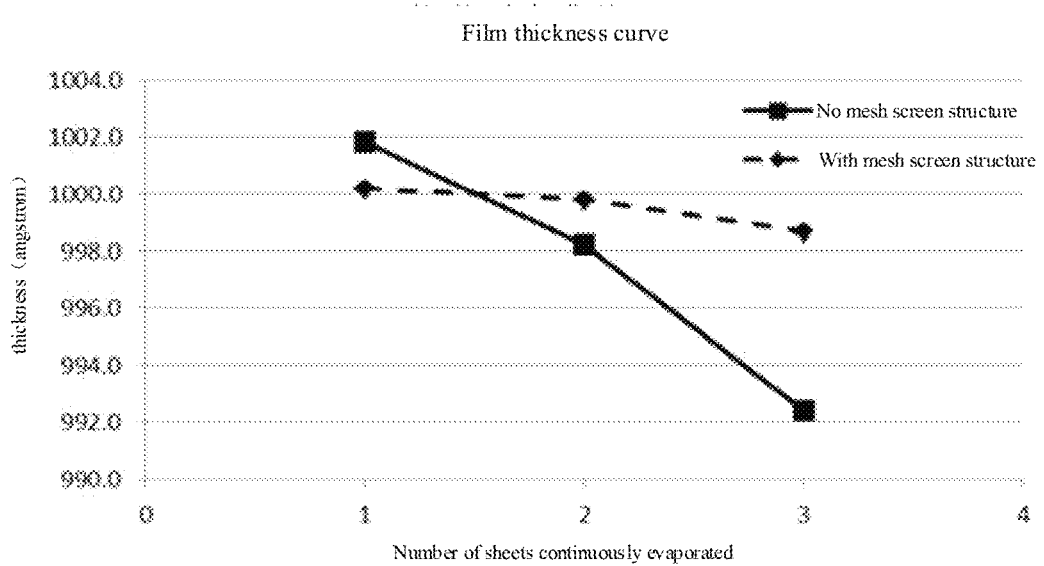
FIG. 7 shows curves of a deposited film thickness monitored by different crystal oscillation probe structures during a evaporation process according to some embodiments of the present disclosure.

FIG. 5 is a schematic diagram showing crystal oscillation frequency attenuation of a crystal oscillation sheet of a crystal oscillation probe structure, FIG. 6 is a schematic diagram showing crystal oscillation frequency attenuation of a crystal oscillation sheet of a crystal oscillation probe structure according to some embodiments of the present disclosure, and FIG. 7 shows curves of a deposited film thickness monitored by different crystal oscillation probe structures during a evaporation process according to some embodiments of the present disclosure. In an entire evaporation process, the crystal oscillation frequency variation of the crystal oscillation probe structure without a mesh screen structure is shown in FIG. 5, a true thickness of a film obtained by the monitoring of the crystal oscillation probe structure without a mesh screen structure is shown in FIG. 7; and the crystal oscillation frequency variation of the crystal oscillation probe structure with a mesh screen structure is shown in FIG. 6, a true thickness of a film obtained by the monitoring of the crystal oscillation probe structure with a mesh screen structure is shown in FIG. 7. For example, the true thickness of the film shown in FIG. 7 may be obtained by an optical thickness gauge.

As shown in FIG. 5 and FIG. 7, in a case where a mesh screen structure is not provided in the crystal oscillation probe structure, a film having a design thickness of 1000 angstroms is formed every time, the crystal oscillation frequency of the crystal oscillation sheet decreases by an average of 3,750 Hz, the true thicknesses of the obtained films are 1001.8 angstroms, 998.2 angstroms and 992.4 angstroms in order, and the true thickness is decreased by 9.4 angstroms. Thus, the crystal oscillation sheet needs to be frequently replaced, so as to avoid a difference between the true thickness of the obtained film and the design thickness being too large, which affects a light-emitting effect of the OLED, for example, color coordinates of light-emitting colors of the OLED are prevented from deviating from a set value.

As shown in FIG. 6 and FIG. 7, in a case where a mesh screen structure is provided in the crystal oscillation probe structure, a film having a design thickness of 1000 angstroms is formed every time, the crystal frequency of the crystal oscillation sheet decreases by an average of 665 Hz, the true thicknesses of the obtained films are 1000.2 angstroms, 999.8 angstroms and 998.7 angstroms in order, and the true thickness is decreased by 1.5 angstroms. Compared with a crystal oscillation probe structure without a mesh screen structure, an average falling speed of the crystal oscillation frequency of the crystal oscillation sheet is dropped more than five times, and a decline degree of the true thickness of the film is less than 1/5. Thus, after the mesh screen structure is disposed in the crystal oscillation probe structure, the life of the crystal oscillation sheets is increased by more than five times, and the crystal oscillation sheets are not required to be frequently replaced, and the cost is lowered. In addition, the difference between the true thickness of the film and the design thickness of the film is small, the thickness repeatability of the film is good, and color coordinates of light-emitting colors of the OLE conform to a set value.

At least one embodiment of the present disclosure provides an evaporation device, the evaporation device includes the crystal oscillation probe structure according to any one of the embodiments above-mentioned.

FIG. 8 is a cross-sectional view of an evaporation device according to some embodiments of the present disclosure.

For example, an evaporation device according to at least one embodiment of the present disclosure further includes an evaporation chamber, an evaporation source and a fixed structure of substrate to be vapor-deposited. The evaporation source, the fixed structure of substrate to be vapor-deposited and the crystal oscillation probe structure are located in the evaporation chamber, the fixed structure of substrate to be vapor-deposited and the crystal oscillation probe structure are disposed side by side on a same side of the evaporation source, and the guide opening of the crystal oscillation probe structure is disposed to face the evaporation source. Illustratively, as shown in FIG. 8, a crystal oscillation probe structure 10, an evaporation source 30 and a fixed structure of substrate to be vapor-deposited 50 are disposed in an evaporation chamber 20. The fixed structure of substrate to be vapor-deposited 50 is used to fix a substrate to be vapor-deposited 40, the crystal oscillation probe structure 10 and the fixed structure of substrate to be vapor-deposited 50 (and the substrate to be vapor-deposited 40 fixed in the fixed structure of substrate to be vapor-deposited 50) are located on a same side of the evaporation source 30, and the vapor deposition material generated by the evaporation source 30 is deposited on the crystal oscillation sheet of the crystal oscillation probe structure 10 and the substrate to be vapor-deposited 40. Thus, by monitoring the thickness of the film deposited on the crystal oscillation sheet of the crystal oscillation probe structure 10, the thickness of the film 41 formed on the substrate to be vapor-deposited 40 can be estimated.

It should be noted that in an actual process, based on a position where the evaporation source is located, there is a certain offset amount between a position of the crystal oscillation probe structure 10 and a position of the substrate to be vapor-deposited 40, such that a deposition rate of the vapor deposition material on the crystal oscillation sheet in the crystal oscillation probe structure 10 and a deposition rate of the vapor deposition material on the substrate to be vapor-deposited 40 are different. Therefore, it is usually necessary to set a correction value. A thickness of the film 41 formed by depositing the vapor deposition material on the substrate to be vapor-deposited 40 is equal to a product of the correction value and a thickness of the film formed by depositing the vapor deposition material on the crystal oscillation sheet.

In a case where the mesh screen structure is not provided in the crystal oscillation probe structure, the above correction value (set as a first correction value) is obtained by a test, that is, after the vapor deposition process is completed, a quotient of the true thickness of the film formed on the substrate to be vapor-deposited 40 and the true thickness of the film formed on the crystal oscillation sheet is the first correction value. In a case where the mesh screen structure is not provided in the crystal oscillation probe structure, a new correction value (set as a second correction value) may be set according to the opening ratio of the mesh screen structure, and the second correction value may be a product of the first correction value and the opening ratio.

Illustratively, in the embodiments shown in FIG. 5 to FIG. 7, in a case where the mesh screen structure is not provided in the crystal oscillation probe structure, the first correction value is 21.7, and the second correction value is 123.2. For example, the diameter of the mesh screen structure is 81 mm, the mesh screen structure is provided with 292 openings, the diameter of each of the openings is 2 mm. Thus, the opening ratio of the mesh screen structure is about 0.178, and the second correction value obtained by calculating a product of the first correction value and the opening ratio is about 121.9, and a deviation rate of the actual value 123.2 of the second correction value and 121.9 is 1%. The deviation rate is within an acceptable range, and therefore, the above calculation relationship conforms to the requirements of the actual process.

For example, the evaporation chamber may be provided with one evaporation source, or a plurality of evaporation sources 30 as shown in FIG. 8. The number of the crystal oscillation probe structures 10 may be the same as the number of evaporation sources 30, such that the crystal oscillation probe structures 10 and the evaporation sources 30 are in one-to-one correspondence. For example, 6-10 evaporation sources may be disposed in the evaporation chamber.

For the present disclosure, the following points should be noted:

(1) The accompanying drawings in the embodiments of the present disclosure only involve structures relevant to the embodiments of the present disclosure, and other structures may refer to the conventional design.

(2) For clarity, in the accompanying drawings of the embodiments of the present disclosure, the thickness of layers or regions is enlarged or reduced. That is, the accompanying drawings are not drawn according to actual scales.

(3) The embodiments of the present disclosure and the characteristics in the embodiments may be mutually combined without conflict.

The described above are only specific embodiments of the present disclosure, and the present disclosure is not limited thereto. The scope of the present disclosure is defined by the accompanying claims.

What is claimed is:

1. A crystal oscillation probe structure, comprising:
a guide cover, comprising a chamber with a guide opening;
a crystal oscillation probe, fixed in the chamber and comprising at least one crystal oscillation sheet;
a mesh screen structure, comprising a plurality of openings, the mesh screen structure being located on a traveling path of a material traveling toward the at least one crystal oscillation sheet and disposed on a side of the at least one crystal oscillation sheet facing the guide opening;
a pedestal, and the at least one crystal oscillation sheet is fixed on a side of the pedestal facing the guiding opening;
wherein at least two crystal oscillation sheets are disposed on the pedestal, a shielding plate is disposed on the pedestal, the shielding plate is located between the crystal oscillation sheet and the guide opening, and
an orthographic projection of one of the crystal oscillation sheets on the pedestal is outside an orthographic projection of the shielding plate on the pedestal, an orthographic projection of remaining crystal oscillation sheets on the pedestal is located within the orthographic projection of the shielding plate on the pedestal; and
an operating lever, wherein one end of the operating lever is connected to the shielding plate, and another end of the operating lever extends to outside of the guide cover.

2. The crystal oscillation probe structure according to claim 1, wherein the mesh screen structure is fixed to the guide cover.

3. The crystal oscillation probe structure according to claim 2, wherein the mesh screen structure is disposed at the guide opening.

4. The crystal oscillation probe structure according to claim 2, wherein the mesh screen structure is located in the chamber and between the guide opening and the at least one crystal oscillation sheet.

5. The crystal oscillation probe structure according to claim 2, wherein the mesh screen structure is located outside the guide cover.

6. The crystal oscillation probe structure according to claim 2, wherein the guide opening and the mesh screen structure are in circular shape.

7. The crystal oscillation probe structure according to claim 6, wherein the plurality of openings are evenly arranged outwardly centering on a circular center of the mesh screen structure.

8. The crystal oscillation probe structure according to claim 1, wherein an opening ratio of the mesh screen structure is 1/10 to 1/2.

9. The crystal oscillation probe structure according to claim 1, wherein a shape of each of the plurality of openings is circular, and a diameter of each of the openings is 0.5 mm to 4 mm.

10. The crystal oscillation probe structure according to claim 1, wherein at least a portion of the guide cover is in a tubular shape, a cross-sectional shape of the tubular shape includes one of a circle, an ellipse, a triangle, a rectangle, and a polygon, and
a shape of each of the plurality of openings includes one of a triangle, a circle, a rectangle, and a polygon.

11. The crystal oscillation probe structure according to claim 1, wherein an inner diameter of the chamber is equal to an inner diameter of the guide opening.

12. An evaporation device, comprising the crystal oscillation probe structure according to claim 1.

13. The evaporation device according to claim 12, further comprising an evaporation chamber, an evaporation source, and a fixed structure of substrate to be vapor-deposited,
wherein the evaporation source, the fixed structure of substrate to be vapor-deposited and the crystal oscillation probe structure are located in the evaporation chamber, the fixed structure of substrate to be vapor-deposited and the crystal oscillation probe structure are disposed side by side on a same side of the evaporation source, and
the guide opening of the crystal oscillation probe structure is disposed to face the evaporation source.

14. A crystal oscillation probe structure, comprising:
a guide cover, comprising a chamber with a guide opening;
a crystal oscillation probe, fixed in the chamber and comprising at least one crystal oscillation sheet;
a mesh screen structure, comprising a plurality of openings, the mesh screen structure being located on a traveling path of a material traveling toward the at least one crystal oscillation sheet and disposed on a side of the at least one crystal oscillation sheet facing the guide opening;
a pedestal, and the at least one crystal oscillation sheet is fixed on a side of the pedestal facing the guiding opening;
wherein at least two crystal oscillation sheets are disposed on the pedestal, a shielding plate is disposed on the pedestal, the shielding plate is located between the crystal oscillation sheet and the guide opening, and
an orthographic projection of one of the crystal oscillation sheets on the pedestal is outside an orthographic projection of the shielding plate on the pedestal, an orthographic projection of remaining crystal oscillation sheets on the pedestal is located within the orthographic projection of the shielding plate on the pedestal, and
a driving unit on the pedestal, wherein the driving unit is connected to the shielding plate, and the driving unit is configured to drive the shielding plate to rotate such that the crystal oscillation sheets are sequentially exposed to the guide opening.

15. The crystal oscillation probe structure according to claim 14, wherein the mesh screen structure is fixed to the guide cover.

16. The crystal oscillation probe structure according to claim 15, wherein the mesh screen structure is disposed at the guide opening.

17. The crystal oscillation probe structure according to claim 15, wherein the mesh screen structure is located in the chamber and between the guide opening and the at least one crystal oscillation sheet.

18. The crystal oscillation probe structure according to claim 15, wherein the mesh screen structure is located outside the guide cover.

19. The crystal oscillation probe structure according to claim 14, wherein an opening ratio of the mesh screen structure is 1/10 to 1/2.

20. The crystal oscillation probe structure according to claim 14, wherein a shape of each of the plurality of openings is circular, and a diameter of each of the openings is 0.5 mm to 4 mm.

* * * * *